(12) United States Patent
Yuge et al.

(10) Patent No.: US 12,356,754 B2
(45) Date of Patent: Jul. 8, 2025

(54) INFRARED SENSOR USING CARBON NANOTUBES AND METHOD FOR MANUFACTURING SAME

(71) Applicant: NEC Corporation, Tokyo (JP)

(72) Inventors: Ryota Yuge, Tokyo (JP); Kaoru Narita, Tokyo (JP); Tomo Tanaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 627 days.

(21) Appl. No.: 17/425,794

(22) PCT Filed: Jan. 17, 2020

(86) PCT No.: PCT/JP2020/001503
§ 371 (c)(1),
(2) Date: Jul. 26, 2021

(87) PCT Pub. No.: WO2020/158455
PCT Pub. Date: Aug. 6, 2020

(65) Prior Publication Data
US 2022/0109076 A1 Apr. 7, 2022

(30) Foreign Application Priority Data
Jan. 29, 2019 (JP) ................. 2019-012928

(51) Int. Cl.
*H10F 77/122* (2025.01)
*H10F 39/18* (2025.01)
(Continued)

(52) U.S. Cl.
CPC ......... *H10F 77/122* (2025.01); *H10F 39/184* (2025.01); *H10F 71/121* (2025.01); *H10F 77/1437* (2025.01); *H10K 30/352* (2023.02)

(58) Field of Classification Search
CPC ....... H01L 31/035227; H01L 27/14649; H01L 31/1804; H01L 31/028; H01L 31/0352;
(Continued)

(56) References Cited

U.S. PATENT DOCUMENTS

2008/0217588 A1* 9/2008 Arnold .................. C01B 32/172
423/445 B
2012/0103809 A1 5/2012 Ihara et al.
(Continued)

FOREIGN PATENT DOCUMENTS

JP 2010-163568 A 7/2010
JP 2011-166070 A 8/2011
(Continued)

OTHER PUBLICATIONS

Christianson et al. ("Dimension effect on the performance of carbon nanotube nanobolometers," Nanotechnology 25, 425503, 2014) (Year: 2014).*

(Continued)

*Primary Examiner* — Yasser A Abdelaziez
(74) *Attorney, Agent, or Firm* — Sughrue Mion, PLLC

(57) ABSTRACT

An object of the present invention is to provide an infrared sensor having a high TCR value, and a method for manufacturing the infrared sensor. The infrared sensor comprises a substrate, a first electrode on the substrate, a second electrode spaced from the first electrode on the substrate, and a carbon nanotube layer electrically connected with the first electrode and the second electrode, wherein the carbon nanotube layer comprises semiconducting carbon nanotubes in an amount more than 66% by mass based on the total amount of carbon nanotubes and 60% or more of the carbon nanotubes contained in the carbon nanotube layer have a diameter within a range of 0.6 to 1.5 nm and a length within a range of 100 nm to 5 μm.

16 Claims, 3 Drawing Sheets

(51) Int. Cl.
*H10F 71/00* (2025.01)
*H10F 77/14* (2025.01)
*H10K 30/35* (2023.01)

(58) Field of Classification Search
CPC .. H01L 31/09; B82Y 30/00; H10K 2102/331; H10K 30/352; C01B 32/168; C01B 32/172; C01B 32/174; G01J 5/02; G01J 5/20; G01J 5/023; H01C 7/04; H10N 10/00; H10N 10/01; H10N 10/855; H10N 15/00; H10F 77/122; H10F 39/184; H10F 71/121; H10F 77/1437; H10F 30/10; H10F 77/14
See application file for complete search history.

(56) References Cited

U.S. PATENT DOCUMENTS

2013/0216469 A1* 8/2013 Sekino ............... G01J 5/0853
252/502
2018/0156668 A1* 6/2018 Bekyarova ............. H10N 19/00
2018/0313775 A1* 11/2018 Iftime ................... G01N 27/04

FOREIGN PATENT DOCUMENTS

| JP | 2015-049207 A | 3/2015 |
| JP | 2017-001919 A | 1/2017 |
| WO | 2010-150808 A1 | 12/2010 |
| WO | 2012/049801 A1 | 10/2018 |

OTHER PUBLICATIONS

Zeng et al. ("Carbon nanotube arrays based high-performance infrared photodetector," Optical Materials Express vol. 2, Issue 6, pp. 839-848, 2012) (Year: 2012).*
Sarkar et al. ("Electrophoretic Deposition of Carbon Nanotubes on 3-Amino-Propyl-Triethoxysilane (APTES) Surface Functionalized Silicon Substrates," Nanomaterials, 3, 272-288, 2013) (Year: 2013).*
International Search Report for PCT Application No. PCT/JP2020/001503, mailed on Apr. 7, 2020.

* cited by examiner

INFRARED SENSOR USING CARBON NANOTUBES AND METHOD FOR MANUFACTURING SAME

This application is a National Stage Entry of PCT/JP2020/001503 filed on Jan. 17, 2020, which claims priority from Japanese Patent Application 2019-012928 filed on Jan. 29, 2019, the contents of all of which are incorporated herein by reference, in their entirety.

TECHNICAL FIELD

The present invention relates to an infrared sensor using carbon nanotubes and a method for manufacturing the same.

BACKGROUND ART

Infrared sensors have a very wide range of applications such as not only monitoring cameras for security, but also thermography for human body, in-vehicle cameras, and inspection of structures, foods, and the like, and are thus actively used in industrial applications in recent years. In particular, development of a low-cost and high-performance infrared sensor capable of obtaining biological information in cooperation with IoT (Internet of Thing) is expected. In uncooled infrared sensors, $VO_x$ (vanadium oxide) has been mainly used in the bolometer unit, but due to high process cost and low practical temperature coefficient resistance (TCR) thereof (about −2.0%/K), improvement of TCR has been widely studied.

Since a material having semiconducting nature and high carrier mobility is required to improve TCR, semiconducting single-walled carbon nanotubes having a large band gap and carrier mobility are expected to be applied to the bolometer unit. However, single-walled carbon nanotubes typically contain nanotubes with semiconducting properties and nanotubes with metallic properties in a ratio of 2:1, and separation is thus required.

Patent Document 1 suggests applying typical single-walled carbon nanotubes to a bolometer unit, and producing a bolometer by a low-cost thin film process in which a dispersion liquid is prepared by mixing single-walled carbon nanotubes in an organic solvent utilizing their chemical stability and then is cast on an electrode. In this case, TCR is successfully improved to about −1.8%/K by subjecting single-walled carbon nanotubes to annealing treatment in the air.

In Patent Document 2, since metallic and semiconducting components are present in a mixed state in single-walled carbon nanotubes, semiconducting single-walled carbon nanotubes of uniform chirality are extracted using an ionic surfactant and applied to the bolometer unit, and TCR of −2.6%/K is thereby successfully achieved.

CITATION LIST

Patent Literature

Patent Document 1: WO 2012/049801
Patent Document 2: Japanese Patent Laid-Open No. 2015-49207

SUMMARY OF INVENTION

Technical Problem

However, in the carbon nanotube thin film used for the infrared sensor described in Patent Document 1, since many metallic carbon nanotubes are present in a mixed state in carbon nanotubes, TCR is low at room temperature and the improvement of the performance of the infrared sensor is limited. In addition, the infrared sensor using semiconducting carbon nanotubes described in Patent Document 2 has a problem in that the ionic surfactant for separation cannot be easily removed.

In view of the foregoing problems, it is an object of the present invention to provide an infrared sensor using semiconducting carbon nanotubes having a high TCR value and a method for manufacturing the same.

Solution to Problem

According to a first aspect of the present invention, there is provided
an infrared sensor comprising:
a substrate;
a first electrode on the substrate;
a second electrode spaced from the first electrode on the substrate; and
a carbon nanotube layer electrically connected with the first electrode and the second electrode,
wherein the carbon nanotube layer comprises semiconducting carbon nanotubes in an amount of more than 66% by mass based on the total amount of carbon nanotubes, and 60% or more of the carbon nanotubes contained in the carbon nanotube layer have a diameter within a range of 0.6 to 1.5 nm and a length within a range of 100 nm to 5 μm.

According to a second aspect of the present invention, there is provided
a method for manufacturing an infrared sensor,
the infrared sensor comprising:
a substrate;
a first electrode on the substrate;
a second electrode spaced from the first electrode on the substrate; and
a carbon nanotube layer electrically connected with the first electrode and the second electrode,
the method comprising the steps of:
mixing carbon nanotubes, a nonionic surfactant, and a dispersion medium to prepare a solution comprising carbon nanotubes;
subjecting the solution to dispersion treatment to disperse and cut the carbon nanotubes, thereby preparing a carbon nanotube dispersion liquid;
subjecting the carbon nanotube dispersion liquid to free flow electrophoresis to separate semiconducting carbon nanotubes and metallic carbon nanotubes, thereby preparing a semiconducting carbon nanotube dispersion liquid comprising semiconducting carbon nanotubes; and
connecting the first electrode and the second electrode by a carbon nanotube layer by the following sub-steps (a) to (c):
(a) applying the semiconducting carbon nanotube dispersion liquid on the substrate;
(b) subjecting the substrate on which the semiconducting carbon nanotube dispersion liquid is applied to heat treatment; and
(c) producing the first electrode and the second electrode on the substrate before the sub-step of applying the semiconducting carbon nanotube dispersion liquid on the substrate, or before or after the sub-step of subjecting the substrate on which the semiconducting carbon nanotube dispersion liquid is applied to heat treatment.

Advantageous Effect of Invention

According to the present invention, an infrared sensor having a high TCR value and a method for manufacturing the same can be provided.

DESCRIPTION OF EMBODIMENTS

The present inventors have found that an infrared sensor having a high TCR value can be obtained by applying semiconducting carbon nanotubes having a specific diameter and length to the bolometer unit. In one embodiment, it has also been found that an infrared sensor that results in a high TCR value can be obtained by applying the semiconducting carbon nanotubes separated from carbon nanotubes using a nonionic surfactant to the bolometer unit. In one embodiment, it has also been found that TCR is further improved by reducing the diameter of the semiconducting carbon nanotubes.

Further, in one embodiment, a nonionic surfactant with a long molecular length is also preferably used as a nonionic surfactant, as mentioned below. Such a nonionic surfactant has a weak interaction with the carbon nanotubes and can be easily removed after applying a dispersion liquid. Therefore, a stable carbon nanotube conductive network can be formed and an excellent TCR value can be obtained. Since such a nonionic surfactant has a long molecular length, the distance between the carbon nanotubes becomes large at the time of applying a dispersion liquid, and the carbon nanotubes are less likely to re-aggregate at the time of producing an electrode. Thus, a carbon nanotube network in an isolated and dispersed state can be formed while keeping a moderate interval, and a large resistance change can be achieved against temperature change. Further, control of the length of the carbon nanotubes facilitates uniform application. For the above reasons, the method for manufacturing the infrared sensor according to the present embodiment is suitable for the printing process. Thus, since the printing process can be used, this method has advantages in that it can reduce the number of steps, allows a reduction in cost in sensor production, and is excellent in mass productivity, as compared with the conventional methods. In one embodiment, it also has an advantage in that it can lower the cost because ultracentrifugation is not necessarily performed in the separation process.

The present invention has characteristics as described above, and examples of embodiments will be described below.

Figure 1:
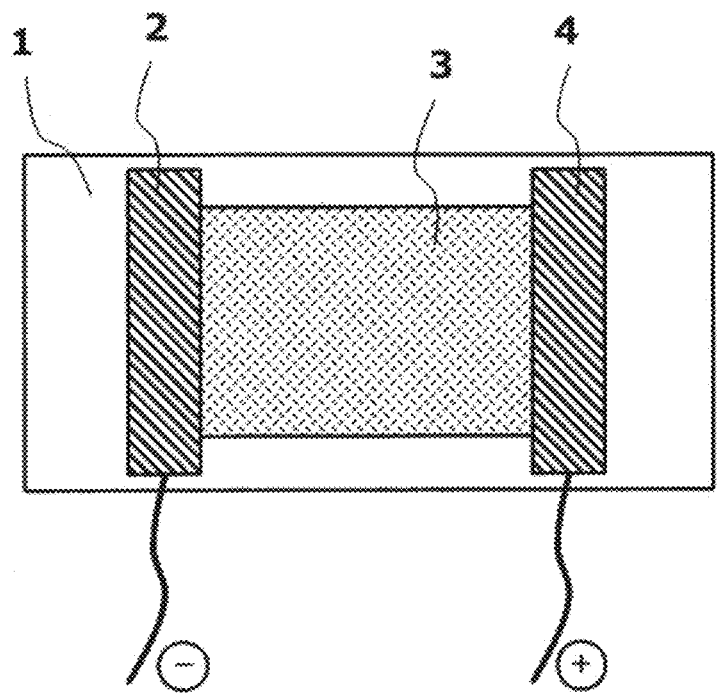
FIG. 1 is a schematic view of the infrared sensor produced by the present invention.

FIG. 1 is a schematic view of an infrared sensor detection unit according to one embodiment of the present invention. A first electrode 2 and a second electrode 4 are positioned on a substrate 1, and these electrodes are connected by a carbon nanotube layer 3 therebetween. This carbon nanotube layer 3 is mainly constituted of a plurality of semiconducting carbon nanotubes separated using a nonionic surfactant, as mentioned below. Such an infrared sensor can be manufactured as follows for example. The surface of $SiO_2$-coated Si serving as a substrate is sequentially washed with acetone, isopropyl alcohol, and water, and is then subjected to oxygen plasma treatment to remove the organics and the like on the surface. The substrate is immersed in an aqueous 3-aminopropyltriethoxysilane (APTES) solution, dried, and then, a semiconducting carbon nanotube dispersion liquid dispersed in a polyoxyethylene alkyl ether solution such as polyoxyethylene (100) stearyl ether or polyoxyethylene (23) lauryl ether, which is a nonionic surfactant, is applied on the substrate and dried. The nonionic surfactant and the like are removed by heating the substrate in an air atmosphere at 200° C. As a result of these procedures, a thin layer of carbon nanotubes is formed on the substrate. Thereafter, the first and the second electrodes are produced over the thin layer of carbon nanotubes at an interval of 50 μm by gold evaporation. An acrylic resin (PMMA) solution is applied to the region between the electrodes on the thin layer of carbon nanotubes formed to form a protective layer made of PMMA. Thereafter, the entire substrate is subjected to oxygen plasma treatment to remove the excess carbon nanotubes and the like on the region other than carbon nanotube layer 3. Excess solvents, impurities, and the like are removed by heating in an air atmosphere at 200° C. The obtained infrared sensor detection unit of FIG. 1 detects the temperature by utilizing the temperature dependence of the electrical resistance caused by light irradiation. Therefore, it can also be used similarly in other frequency regions as long as the temperature changes by light irradiation, and for example, the terahertz region can also be detected. In addition, the detection of the change in electrical resistance caused by temperature change can also be performed not only by the structure of FIG. 1, but also by providing a gate electrode to form a field effect transistor and thereby amplifying the change in resistance value.

Figure 2:
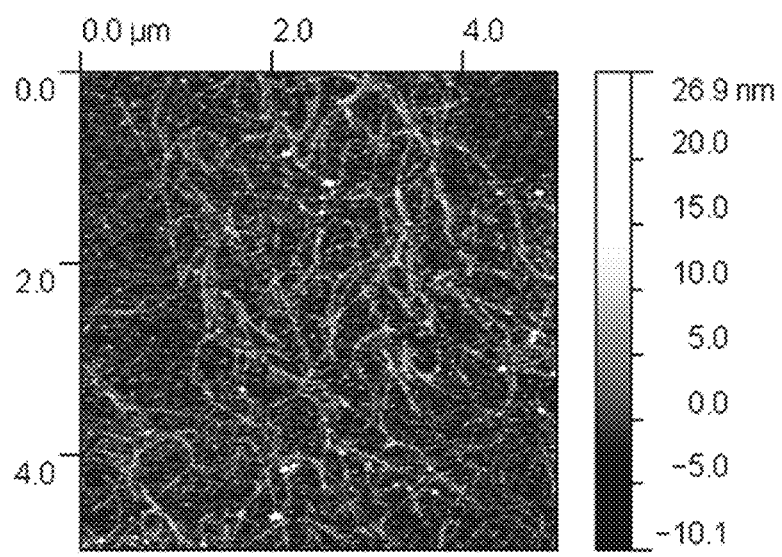
FIG. 2 is an atomic force microscope image of a carbon nanotube film produced by the present invention.

FIG. 2 is an example of an atomic force microscope (AFM) image of the carbon nanotubes on the substrate. The carbon nanotubes are in a substantially isolated and dispersed state, have a uniform diameter distribution and a network structure, and form conductive paths.

As used herein, the term "carbon nanotube layer" is constituted by a plurality of carbon nanotubes forming conductive paths which electrically connect the first electrode and the second electrode. The plurality of carbon nanotubes may form a structure such as, for example, parallel, fibrous, and network, and preferably form a network structure because aggregation is less likely to occur and uniform conductive paths can be obtained. As used herein, the "carbon nanotube layer" may also be described as "carbon nanotube film".

As the carbon nanotubes, single-walled, double-walled, and multi-walled carbon nanotubes may be used, but when semiconducting carbon nanotubes are separated, single-walled or few-walled (for example, double-walled or triple-walled) carbon nanotubes are preferred, and single-walled carbon nanotubes are more preferred. The carbon nanotubes preferably comprise single-walled carbon nanotubes in an amount of 80% by mass or more, and more preferably 90% by mass or more (including 100% by mass).

The diameter of the carbon nanotubes is preferably between 0.6 and 1.5 nm, more preferably 0.6 nm to 1.2 nm, and further preferably 0.7 to 1.1 nm, from the viewpoint of increasing the band gap to improve TCR. In one embodiment, the diameter of 1 nm or less may be particularly preferred in some cases. When the diameter is 0.6 nm or more, the manufacture of carbon nanotubes becomes much easier. When the diameter is 1.5 nm or less, the band gap is easily maintained in an appropriate range and a high TCR can be obtained.

As used herein, the diameter of the carbon nanotubes means that when the carbon nanotubes on the substrate are observed using an atomic force microscope (AFM) and the diameter thereof is measured at about 50 positions, 60% or more, preferably 70% or more, optionally preferably 80% or more, more preferably 100% thereof is within a range of 0.6 to 1.5 nm. It is preferred that 60% or more, preferably 70% or more, optionally preferably 80% or more, and more preferably 100% thereof be within a range of 0.6 to 1.2 nm, and further preferably within a range of 0.7 to 1.1 nm. In one embodiment, 60% or more, preferably 70% or more, optionally preferably 80% or more, and more preferably 100% thereof is within a range of 0.6 to 1 nm.

The length of the carbon nanotubes is preferably between 100 nm to 5 µm because dispersion is easy and application properties are excellent. Also, from the viewpoint of conductivity of the carbon nanotubes, the length is preferably 100 nm or more. When the length is 5 µm or less, aggregation on the substrate is easily suppressed. The length of the carbon nanotubes is more preferably 500 nm to 3 µm, and further preferably 700 nm to 1.5 µm.

As used herein, the length of the carbon nanotubes means that, when at least 50 carbon nanotubes are observed using an atomic force microscope (AFM) and enumerated to measure the distribution of the length of the carbon nanotubes, 60% or more, preferably 70% or more, optionally preferably 80% or more, and more preferably 100% thereof is within a range of 100 nm to 5 µm. It is preferred that 60% or more, preferably 70% or more, optionally preferably 80% or more, and more preferably 100% thereof be within a range of 500 nm to 3 µm. It is more preferred that 60% or more, preferably 70% or more, optionally preferably 80% or more, and more preferably 100% thereof be within a range of 700 nm to 1.5 µm.

When the diameter and length of the carbon nanotubes are within the above range, the influence of semiconductive properties becomes large and a large current value can also be obtained, and thus, a high TCR value is likely to be obtained when the carbon nanotubes are used in an infrared sensor.

The thickness of the carbon nanotube layer is not particularly limited, and is, for example, 1 nm or more, for example, a few nm to 100 µm, and preferably 10 nm to 10 µm, and in one embodiment, it is more preferably in a range of 50 nm to 10 µm.

The content of semiconducting carbon nanotubes, preferably semiconducting single-walled carbon nanotubes in the carbon nanotubes is generally more than 66% by mass, preferably 67% by mass or more, further preferably 70% by mass or more, and further preferably 80% by mass or more. In particular, it is preferably 90% by mass or more, more preferably 95% by mass or more, and further preferably 99% by mass or more (including 100% by mass).

In the infrared sensor of the present embodiment, the distance between its electrodes is preferably 1 µm to 500 µm, and for miniaturization, it is more preferably 5 to 200 µm. When the distance is 5 µm or more, a reduction in the nature of TCR can be suppressed, even in the case of containing a small amount of metallic carbon nanotubes. In addition, the distance of 500 µm or less is advantageous when the infrared sensor is applied to an image sensor by two-dimensionally arraying the infrared sensors.

In a plurality of carbon nanotubes that connect the first electrode and the second electrode, the number of carbon nanotubes between the electrodes (the number density of the carbon nanotubes in carbon nanotube layer (3)) is preferably 1 nanotube/µm² to 1000 nanotubes/µm², more preferably 10 nanotubes/µm² to 500 nanotubes/µm², and more preferably 50 nanotubes/µm² to 300 nanotubes/µm². In one embodiment, it may be preferably 10 nanotubes/µm² to 100 nanotubes/µm² in some cases. When the number is less than 1 nanotube/µm², it is difficult to form conductive paths. When it is 1000 nanotubes/µm² or less, a reduction in the nature of TCR is likely to be suppressed even in the case of containing a small amount of metallic carbon nanotubes. The number of carbon nanotubes can be calculated for example by counting the number of carbon nanotubes per area at random 10 spots (each having a region of 1 µm×1 µm) on the carbon nanotube layer using AFM and averaging the obtained results.

As the constitutions of the substrate, electrode, and the like, those mentioned below may be used.

The infrared sensor with the carbon nanotubes as mentioned above may be manufactured by, for example, a method comprising a cutting and dispersion step of carbon nanotubes and a separation step, using the nonionic surfactant as described below, but may also be manufactured using other methods.

An example of the method for manufacturing the infrared sensor according to one embodiment of the present invention will be described in detail below.

As the carbon nanotubes, those from which surface functional groups and impurities such as amorphous carbon, catalysts, and the like have been removed by performing a heat treatment under an inert atmosphere, in a vacuum may be used. The heat treatment temperature may be appropriately selected and is preferably 800 to 2000° C., and more preferably 800 to 1200° C.

The nonionic surfactant may be appropriately selected, and it is preferred to use nonionic surfactants constituted by a hydrophilic portion which is not ionized and a hydrophobic portion such as an alkyl chain, for example, nonionic surfactants having a polyethylene glycol structure exemplified by polyoxyethylene alkyl ethers, and alkyl glucoside based nonionic surfactants, singly or in combination. As such a nonionic surfactant, polyoxyethylene alkyl ether represented by Formula (1) is preferably used. In addition, the alkyl moiety may have one or a plurality of unsaturated bonds.

$$C_nH_{2n+1}(OCH_2CH_2)_mOH \quad (1)$$

wherein, n=preferably 12 to 18, and m=10 to 100, and preferably 20 to 100.

In particular, a nonionic surfactant specified by polyoxyethylene (n) alkyl ether (wherein n=20 or more and 100 or less, and the alkyl chain length is C12 or more and C18 or less) such as polyoxyethylene (23) lauryl ether, polyoxyethylene (20) cetyl ether, polyoxyethylene (20) stearyl ether, polyoxyethylene (10) oleyl ether, polyoxyethylene (10) cetyl ether, polyoxyethylene (10) stearyl ether, polyoxyethylene (20) oleyl ether, polyoxyethylene (100) stearyl ether is more preferred. In addition, N,N-bis[3-(D-gluconamido)propyl]deoxycholamide, n-dodecylβ-D-maltoside, octyl β-D-glucopyranoside, and digitonin may also be used.

As the nonionic surfactant, polyoxyethylene sorbitan monostearate (molecular formula: $C_{64}H_{126}O_{26}$, trade name: Tween 60, manufactured by Sigma-Aldrich, etc.), polyoxyethylene sorbitan trioleate (molecular formula: $C_{24}H_{44}O_6$, trade name: Tween 85, manufactured by Sigma-Aldrich, etc.), octylphenol ethoxylate (molecular formula: $C_{14}H_{22}O$ ($C_2H_4O)_n$, n=1 to 10, trade name: Triton X-100, manufactured by Sigma-Aldrich, etc.), polyoxyethylene (40) isooctylphenyl ether (molecular formula: $C_8H_{17}C_6H_{40}(CH_2CH_{20})_{40}H$, trade name: Triton X-405, manufactured by Sigma-Aldrich, etc.), poloxamer (molecular formula: $C_5H_{10}O_2$, trade name: Pluronic, manufactured by Sigma-Aldrich, etc.), polyvinyl pyrrolidone (molecular formula: $(C_6H_9NO)_n$, n=5 to 100, manufactured by Sigma-Aldrich, etc.) may be used.

The molecular length of the nonionic surfactant is preferably 5 to 100 nm, more preferably 10 to 100 nm, and further preferably 10 to 50 nm. When the molecular length is 5 nm or more, in particular, 10 nm or more, the distance between carbon nanotubes can be appropriately held and aggregation is easily suppressed after the dispersion liquid is applied on the electrodes (to the region including the region between electrode 1 and electrode 2). The molecular length of 100 nm or less is preferred from the viewpoint of constructing a network structure.

The method for obtaining a dispersion solution is not particularly limited, and conventionally known methods can be applied. For example, a carbon nanotube mixture, a dispersion medium, and a nonionic surfactant are mixed to prepare a solution containing carbon nanotubes, and this solution is subjected to sonication to disperse the carbon nanotubes, thereby preparing a carbon nanotube dispersion liquid (micelle dispersion solution). The dispersion medium is not particularly limited, as long as it is a solvent that allows carbon nanotubes to disperse and suspend during the separation step, and for example, water, heavy water, an organic solvent, an ionic liquid, or a mixture thereof may be used, and water and heavy water are preferred. In addition to or instead of the sonication mentioned above, a technique of dispersing carbon nanotubes by a mechanical shear force may be used. The mechanical shearing may be performed in a gas phase. In a micelle dispersion aqueous solution of the carbon nanotubes and the nonionic surfactant, the carbon nanotubes are preferably in an isolated state. Thus, if necessary, bundles, amorphous carbon, impurity catalysts, and the like may be removed using an ultracentrifugation treatment. During the dispersion treatment, the carbon nanotubes can be cut, and the length thereof can be controlled by changing the grinding conditions of the carbon nanotubes, ultrasonic output, ultrasonic treatment time, and the like. For example, the aggregate size can be controlled by grinding the untreated carbon nanotubes using tweezers, a ball mill, or the like. After these treatments, the length can be controlled to 100 nm to 5 μm using an ultrasonic homogenizer by setting the output to 40 to 600 W, optionally 100 to 550 W, 20 to 100 KHz, the treatment time to 1 to 5 hours, preferably up to 3 hours. When the treatment time is shorter than 1 hour, the carbon nanotubes may be hardly dispersible depending on the conditions, and may remain almost the original length in some cases. From the viewpoint of shortening the dispersion treatment time and reducing the cost, the treatment time is preferably 3 hours or less. The present embodiment may also have the advantage of ease of adjustment of cutting due to use of a nonionic surfactant. In addition, the infrared sensor according to the present embodiment manufactured by using the carbon nanotubes prepared by a method using a nonionic surfactant has the advantage of containing no ionic surfactant which is difficult to be removed.

Dispersion and cutting of the carbon nanotubes generate a surface functional group at the surface or the end of the carbon nanotube. Functional groups such as carboxyl group, carbonyl group, and hydroxyl group are generated. When the treatment is performed in a liquid phase, a carboxyl group and a hydroxyl group are generated, and when the treatment is performed in a gas phase, a carbonyl group is generated.

The concentration of the surfactant in the liquid comprising heavy water or water and a nonionic surfactant mentioned above is preferably from the critical micelle concentration to 10% by mass, and more preferably from the critical micelle concentration to 3% by mass. The concentration equal to or less than the critical micelle concentration is not preferred because dispersion is impossible. When the concentration is 10% by mass or less, a sufficient density of carbon nanotubes can be applied after separation, while reducing the amount of surfactant. As used herein, the critical micelle concentration (CMC) refers to the concentration serving as an inflection point of the surface tension measured by, for example, changing the concentration of an aqueous surfactant solution using a surface tensiometer such as a Wilhelmy surface tensiometer at a constant temperature. As used herein, the "critical micelle concentration" is a value under atmospheric pressure at 25° C.

The concentration of the carbon nanotubes in the above cutting and dispersion step (the weight of the carbon nanotubes/(the total weight with the dispersion medium and the surfactant)×100) is not particularly limited, and for example, may be 0.0003 to 10% by mass, preferably 0.001 to 3% by mass, and more preferably 0.003 to 0.3% by mass.

The dispersion liquid obtained through the aforementioned cutting and dispersion step may be used as it is in the separation step mentioned below, or steps such as concentration and dilution may be performed before the separation step.

Separation of the carbon nanotubes can be performed by, for example, the electric-field-induced layer formation method (ELF method: see, for example, K. Ihara et al. J. Phys. Chem. C. 2011, 115, 22827 to 22832 and Japanese Patent No. 5717233, which are incorporated herein by reference). One example of the separation method using the ELF method will be described. Carbon nanotubes, preferably single-walled carbon nanotubes are dispersed by a nonionic surfactant, and the dispersion liquid is put into a vertical separation apparatus, and then a voltage is applied to the electrodes arranged above and below, so that the carbon nanotubes are separated by free flow electrophoresis. The mechanism of separation can be inferred as follows. When the carbon nanotubes are dispersed by the nonionic surfactant, the micelle of the semiconducting carbon nanotubes has a negative zeta potential, whereas the micelle of the metallic carbon nanotubes has an opposite (positive) zeta potential (in recent years, it is considered that the metallic carbon nanotubes have a slightly negative zeta potential or are barely charged). Thus, when an electric field is applied to the carbon nanotube dispersion liquid, the micelle of the semiconducting carbon nanotubes is electrophoresed toward the anode (+) direction, and the micelle of the metallic carbon nanotubes is electrophoresed toward the cathode (−) direction by the effects of the difference between the zeta potentials, and the like. Eventually, the layer in which the semiconducting carbon nanotubes are concentrated is formed near the anode, and the layer in which the metallic carbon nanotubes are concentrated is formed near the cathode in the separation tank. The voltage for separation may be appropriately set in consideration of the composition of the dispersion medium, the charge amount of carbon nanotubes, and the like, and is preferably 1 V or more and 200 V or less, and more preferably 10 V or more and 200 V or less. It is preferably 100 V or more from the viewpoint of shortening the time for the separation step. It is preferably 200 V or less from the viewpoint of suppressing the generation of bubbles during separation and maintaining the separation efficiency. The purity is improved by repeating separation. The same separation procedure may be performed by resetting the dispersion liquid after separation to the initial concentration. As a result, the purity can be further increased.

Through the aforementioned dispersion and cutting step and separation step of the carbon nanotubes, a dispersion liquid in which the semiconducting carbon nanotubes having the desired diameter and length are concentrated can be obtained. As used herein, the carbon nanotube dispersion liquid in which semiconducting carbon nanotubes are concentrated may be referred to as the "semiconducting carbon nanotube dispersion liquid". The semiconducting carbon nanotube dispersion liquid obtained through the separation step means the dispersion liquid comprising the semiconducting carbon nanotubes in an amount of generally more than 66% by mass, preferably 67% by mass or more, more preferably 70% by mass or more, particularly preferably 80% by mass or more, more preferably 90% by mass or more, more preferably 95% by mass or more, and further preferably 99% by mass or more (the upper limit may be 100% by mass) based on the total amount of carbon nanotubes. The separation tendency of the metallic and semiconducting carbon nanotubes can be analyzed by microscopic Raman spectroscopy and ultraviolet-visible near-infrared absorptiometry.

The centrifugation treatment may be performed to remove the bundles, amorphous carbon, metal impurities, and the like in the carbon nanotube dispersion liquid after the aforementioned dispersion and cutting step of the carbon nanotubes and before the separation step. The centrifugal acceleration may be appropriately adjusted, and is preferably 10000×g to 500000×g, more preferably 50000×g to 300000×g, and optionally 100000×g to 300000×g. The centrifugation time is preferably 0.5 hours to 12 hours, and more preferably 1 to 3 hours. The centrifugation temperature may be appropriately adjusted, and is preferably 4° C. to room temperature, and more preferably 10° C. to room temperature.

In one embodiment, it may be preferred that ultracentrifugation treatment is not performed. In particular, bundle formation is easily suppressed in embodiments in which the dispersion liquid comprising carbon nanotubes comprises a nonionic surfactant, in particular, a nonionic surfactant having a large molecular length, and thus, there are also advantages that the number of process steps can be reduced and the cost can be reduced without performing the ultracentrifugation treatment.

The semiconducting carbon nanotube dispersion liquid obtained through the aforementioned steps is applied on a substrate and dried, and then a heat treatment is optionally performed, so that a carbon nanotube layer is formed.

As the substrate, one in which at least the element formation surface has insulating property or semiconducting property may be used, and in particular, one having an insulating element formation surface is preferred. For example, Si, $SiO_2$-coated Si, $SiO_2$, SiN, parylene, polymer, resin, and plastic may be used, without being limited thereto.

The concentration of the surfactant in the carbon nanotube dispersion liquid after separation which is used for the application to the substrate may be appropriately controlled. The concentration of the surfactant in the carbon nanotube dispersion liquid upon application to the substrate is preferably from the critical micelle concentration to about 5% by mass, more preferably 0.001% by mass to 3% by mass, and particularly preferably 0.01 to 1% by mass to suppress the reaggregation after application and the like.

The zeta potential of the semiconducting carbon nanotube dispersion liquid is preferably +5 mV to −40 mV, more preferably +3 mV to −30 mV, and further preferably +0 mV to −20 mV. The zeta potential of +5 mV or less is preferred because it means that the content of the metallic carbon nanotubes is low. If the zeta potential is higher than −40 mV, separation is difficult in the first place. Here, the zeta potential of the semiconducting carbon nanotube dispersion liquid refers to the zeta potential of the semiconducting carbon nanotube dispersion liquid containing a nonionic surfactant and the micelle of the semiconducting carbon nanotubes obtained through, for example, the separation step by the above ELF method.

As used herein, the zeta potential of the carbon nanotube dispersion liquid is a value obtained by measuring the dispersion liquid using an ELSZ apparatus (Otsuka Electronics Co., Ltd.).

The method for applying the carbon nanotube dispersion liquid to the substrate is not particularly limited, and examples thereof include dropping method, spin coating, printing, inkjet, spray coating, dip coating, and the like. From the viewpoint of reducing the manufacturing cost of the infrared sensor, a printing method is preferred.

The surfactant and the solvent can be removed from the carbon nanotubes applied on the substrate by heat treatment. The temperature of the heat treatment may be appropriately set as long as it is equal to or higher than the decomposition temperature of the surfactant, and it is preferably 150 to 400° C., and more preferably 200 to 400° C. A temperature of 200° C. or more is preferred because the remaining of the decomposition product of the surfactant can be easily suppressed. A temperature of 400° C. or less is preferred because the change in the quality of the substrate can be suppressed. Also, the decomposition of carbon nanotubes, the change in size, the leaving of functional groups, and the like can be suppressed.

The first electrode and the second electrode on the substrate can be produced using gold, platinum, and titanium singly or in combination. The method for producing the electrode is not particularly limited, and examples thereof include vapor deposition, sputtering, and printing method. The thickness may be appropriately adjusted and is preferably 10 nm to 1 mm, and more preferably 50 nm to 1 μm. The above dispersion liquid may be applied to the substrate on which the electrodes are provided in advance, or the electrode may be produced after the dispersion liquid is applied, before or after the heat treatment.

A protective film may be provided on the surface of the carbon nanotube layer, if necessary. The protective film is preferably a material with high transparency in the infrared wavelength range to be detected. Examples thereof include acrylic resins such as PMMA and PMMA anisole, epoxy resins, and Teflon®.

The infrared sensor according to the present embodiment may be a single element or may be an array in which a plurality of elements are two-dimensionally arranged such as those used in an image sensor.

This application is based upon and claims the benefit of priority from Japanese patent application No. 2019-012928, filed on Jan. 29, 2019, the disclosure of which is incorporated herein in its entirety by reference.

EXAMPLES

The present invention will be described further in detail by way of Examples below. Of course, the present invention should not be limited by the following examples.

Example 1

(Step 1)

100 mg of single-walled carbon nanotubes (Meijo Nano Carbon Co., Ltd., EC 1.0 (diameter: about 1.1 to 1.5 nm (average diameter 1.2 nm)) was put in a quartz boat and heat treatment was performed under a vacuum atmosphere using an electric furnace. It was performed at a heat treatment temperature of 900° C. for 2 hours. The weight after heat treatment was reduced to 80 mg, and it was found that the surface functional groups and impurities were removed. After the obtained single-walled carbon nanotubes were fractured with tweezers, 12 mg of which was immersed in 40 ml of an aqueous solution of 1 wt % surfactant (polyoxyethylene (100) stearyl ether) and after sufficient sedimentation, the mixture was subjected to ultrasonic dispersion treatment (BRANSON ADVANCED-DIGITAL SONIFIER apparatus (output: 50 W)) for 3 hours. Through this step, aggregates of the carbon nanotubes in the solution were eliminated. Thereafter, ultracentrifugation treatment was performed under conditions of 50000 rpm at 10° C. for 60 minutes. Through this procedure, bundles, remaining catalysts, and the like were removed to obtain a carbon nanotube dispersion liquid. At this point, the dispersion liquid was applied on a $SiO_2$ substrate and dried at 100° C., which was then observed by an atomic force microscope (AFM). As a result, it was found that 70% of the single-walled carbon nanotubes had a length within a range of 500 nm to 1.5 μm and the average length thereof was approximately 800 nm. On the other hand, when the carbon nanotubes were dispersed using an ionic surfactant (sodium dodecyl sulfate (SDS)) in the same conditions for comparison purposes, the average length thereof was approximately 1.5 μm or more and the length was longer.

(Step 2)

Figure 3:
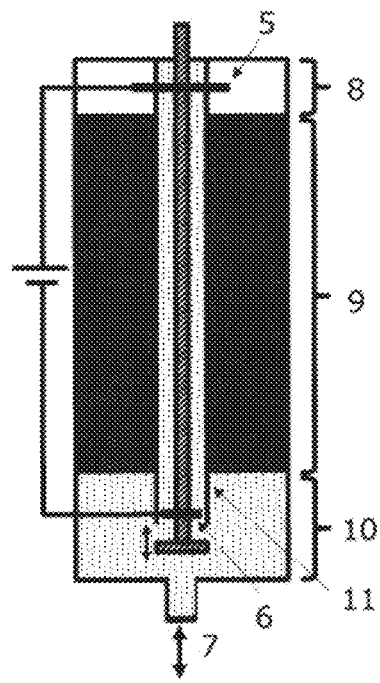
FIG. 3 is a schematic view of a metal-semiconductor separation apparatus used in the present invention.

The carbon nanotube dispersion liquid was introduced into the separation apparatus of FIG. 3. Here, water 8 (about 15 ml), carbon nanotube dispersion liquid 9 (about 70 ml), 2 wt % aqueous surfactant solution 10 (about 15 ml) were put in from the inlet with inner tube 11 closed, and thereafter, 2 wt % aqueous surfactant solution (about 20 ml) was put into inner tube 11. Thereafter, inner tube 11 was opened, resulting in a three-layer structure as shown in FIG. 3. A voltage of 120 V was applied, and semiconducting carbon nanotubes were transferred towards the anode side. On the other hand, metallic carbon nanotubes were transferred towards the cathode side. After 80 hours from the start of separation, they were separated cleanly. The separation step was carried out at room temperature (about 25° C.). When the carbon nanotube dispersion liquid transferred to the anode side was analyzed using the light absorption spectrum, it was found that the metallic carbon nanotubes components were removed. It was also found from the Raman spectrum that 99 wt % of the carbon nanotubes were semiconducting carbon nanotubes. At this time, the most frequent diameter of the single-walled carbon nanotubes was about 1.2 nm (70% or more), and the average diameter was 1.2 nm.

The zeta potential of the obtained semiconducting carbon nanotube dispersion liquid was measured using an ELSZ apparatus (Otsuka Electronics Co., Ltd.), resulting in approximately −10 mV.

(Step 3)

A substrate in which a silicon substrate is coated with 100 nm of $SiO_2$ was prepared. The substrate was washed by sequentially immersing the substrate in acetone, isopropyl alcohol, and ultrapure water, and subjecting the substrate to sonication. After drying with nitrogen, the substrate was subjected to oxygen plasma treatment for 3 minutes. The substrate was immersed in a 0.1% APTES aqueous solution for 30 minutes. After water washing, the substrate was dried at 105° C. A carbon nanotube dispersion liquid (about 0.1 ml) adjusted to a concentration of 0.7 wt % was added dropwise on the obtained substrate, which was allowed to stand for 30 minutes, washed with ethanol, and then dried at 110° C. The substrate was heated in an air atmosphere at 200° C. to remove the nonionic surfactant and the like. Thereafter, gold was vapor deposited to a thickness of 100 nm at two positions on the substrate at an interval of 50 μm. The region between the electrodes on the obtained substrate was observed by an atomic force microscope (AFM) (FIG. 2). Since the surfactant was removed, it was found that the single-walled carbon nanotubes having a diameter of about 1.1 to 1.5 nm (average diameter is 1.2 nm) were dispersed in a net state. The average length calculated by AFM observation was 1000 nm (70% or more of the carbon nanotubes were in a range of 0.8 to 1.2 μm). It was also found that the neighboring single-walled carbon nanotubes were not reaggregated because the molecular length of the surfactant was long. Then, a PMMA anisole solution was applied between the electrodes to protect the carbon nanotubes between the electrodes, and then, excess carbon nanotubes and the like near the electrodes were removed by oxygen plasma treatment. Thereafter, the substrate was dried at 200° C. for 1 hour.

In the produced substrate, the number of the carbon nanotubes in carbon nanotube layer 3 was measured using AFM, resulting in approximately 200 nanotubes/μm².

(Step 4)

Figure 4:
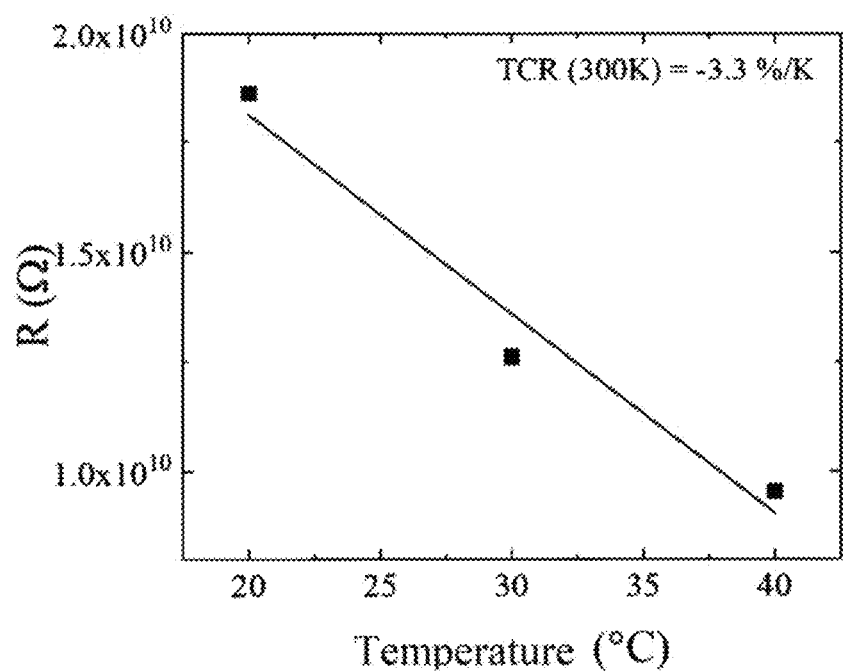
FIG. 4 is a graph showing TCR values of the infrared sensor produced by the present invention.

FIG. 4 shows the change in resistance value when the temperature of the infrared sensor produced in step 3 was changed. The TCR value (dR/RdT) was about −3.3%/K at 300 K. It was found that this value largely exceeds that of Comparative Example 1 and −2%/K of the conventionally used vanadium oxide. This is because almost all the carbon nanotubes constituting the carbon nanotube layer are semiconducting carbon nanotubes having a small diameter and a large band gap. This is also because, since the nonionic surfactant can be easily removed and the surfactant had a large size, the formation of bundles was suppressed and an isolated and dispersed carbon nanotube network was formed.

Comparative Example 1

An infrared sensor was produced using a carbon nanotube dispersion liquid produced in the same manner as in step 1 of Example 1 and in the same process as step 3 except for not performing the separation step in step 2. The TCR value at this time was about −0.5%/K. The low TCR value is due to the high content of metallic carbon nanotubes.

Example 2

Figure 5:
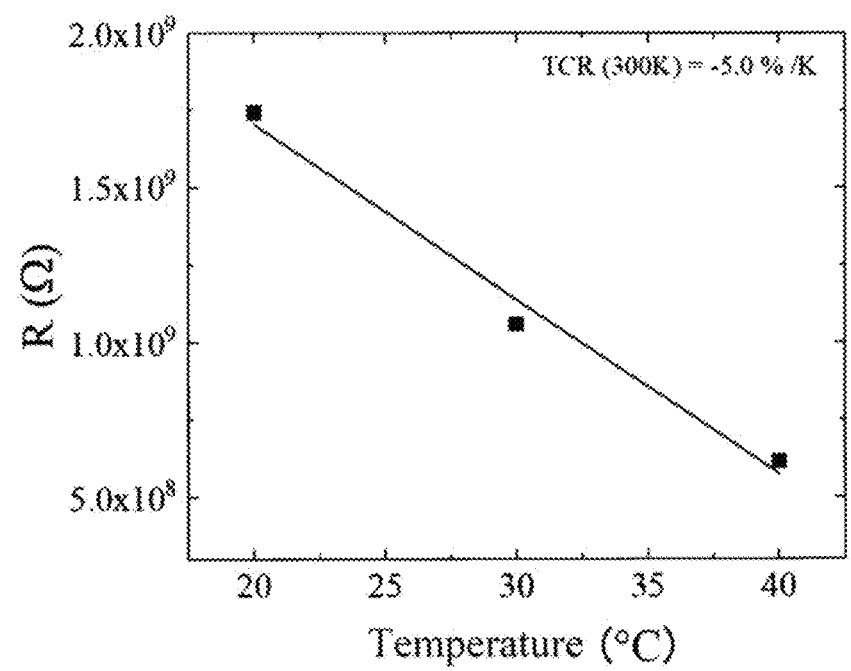
FIG. 5 is a graph showing TCR values of the infrared sensor produced by the present invention.

An infrared sensor was produced in the same process as step 1 to 3 in Example 1 with single-walled carbon nanotubes, at least 70% of which have a diameter about 0.8 to 1.1 nm (average diameter: 0.9 nm), except that carbon nanotubes having a small diameter of about 0.8 to 1.1 nm (average diameter: 0.9 nm) were used as the raw material in step 1 in Example 1. FIG. 5 shows the change in resistance value when the temperature of the infrared sensor was changed. The TCR value (dR/RdT) was about −5.0%/K at 300 K. This high TCR value is due to the further reduced diameter and the increased band gap. From these results, it was found that the TCR value can be controlled by changing the diameter of the carbon nanotubes.

Comparative Example 2

An infrared sensor was produced in the same process as step 1 to 3 in Example 1 with single-walled carbon nanotubes, at least 70% of which have a diameter about 1.6 to 1.9 nm (average diameter: 1.8 nm), except that carbon nanotubes having a large diameter of about 1.6 to 1.9 nm (average diameter: 1.8 nm) were used as the raw material in step 1 in Example 1. The TCR value at this time was about −2.0%/K. This is because when the diameter is large, the band gap is small.

While the invention has been described with reference to example embodiments and examples thereof, the invention is not limited to these embodiments and examples. Various changes that can be understood by those of ordinary skill in the art may be made to form and details of the present invention without departing from the spirit and scope of the present invention.

EXPLANATION OF REFERENCE

1 Substrate
2 Electrode 1 (first electrode)
3 Carbon nanotube film (carbon nanotube layer)
4 Electrode 2 (second electrode)
5 Cathode
6 Anode
7 Inlet/Outlet
8 Water
9 Carbon nanotube dispersion liquid
10 Surfactant solution
11 Inner tube

What is claimed is:

1. A bolometer-type infrared sensor comprising:
a substrate;
a first electrode on the substrate;
a second electrode spaced from the first electrode on the substrate; and
a carbon nanotube layer electrically connected with the first electrode and the second electrode,
wherein the carbon nanotube layer comprises semiconducting carbon nanotubes in an amount of more than 66% by mass based on the total amount of carbon nanotubes, and 70% or more of the carbon nanotubes contained in the carbon nanotube layer have a diameter within a range of 0.7 to 1.1 nm and a length within a range of 500 nm to 1.5 μm,
a distance between the first electrode and the second electrode is 10 μm to 500 μm,
a number density of the carbon nanotubes in the carbon nanotube layer is 1 nanotube/μm$^2$ to 1000 nanotubes/μm$^2$, and
the carbon nanotubes form a network structure in the carbon nanotube layer.

2. The bolometer-type infrared sensor according to claim 1, wherein the semiconducting carbon nanotubes have at least one surface functional group selected from carboxyl group, carbonyl group, and hydroxyl group at at least a surface of the carbon nanotube or an end of the nanotube.

3. The bolometer-type infrared sensor according to claim 1, wherein the carbon nanotube layer comprises the semiconducting carbon nanotubes in an amount of 90% by mass or more based on the total amount of carbon nanotubes.

4. The bolometer-type infrared sensor according to claim 1, wherein a thickness of the carbon nanotube layer is 1 nm or more and 10 μm or less.

5. The bolometer-type infrared sensor according to claim 1, wherein a thickness of the carbon nanotube layer is 10 nm to 10 μm.

6. The bolometer-type infrared sensor according to claim 1, wherein the number density of the carbon nanotubes in the carbon nanotube layer is 50 nanotubes/μm$^2$ to 300 nanotubes/μm$^2$.

7. The bolometer-type infrared sensor according to claim 1, further comprising 3-aminopropyltriethoxysilane (APTES) between the substrate and the carbon nanotube layer.

8. The bolometer-type infrared sensor according to claim 6, further comprising 3-aminopropyltriethoxysilane (APTES) between the substrate and the carbon nanotube layer.

9. The bolometer-type infrared sensor according to claim 1, further comprising a protective film on a surface of the carbon nanotube layer.

10. The bolometer-type infrared sensor according to claim 9, wherein the protective film comprises an acrylic resin, an epoxy resin, or polytetrafluoroethylene (PTFE).

11. The bolometer-type infrared sensor according to claim 10, wherein the protective film comprises PMMA.

12. The bolometer-type infrared sensor according to claim 6, further comprising a protective film on a surface of the carbon nanotube layer.

13. The bolometer-type infrared sensor according to claim 1, wherein 70% or more of the carbon nanotubes contained in the carbon nanotube layer have a length within a range of 700 nm to 1.5 μm.

14. The bolometer-type infrared sensor according to claim 1, wherein 70% or more of the carbon nanotubes contained in the carbon nanotube layer have a length within a range of 0.8 μm to 1.2 μm.

15. The bolometer-type infrared sensor according to claim 1, wherein the carbon nanotube layer comprises semiconducting carbon nanotubes in an amount of 99% or more by mass based on the total amount of carbon nanotubes.

16. The bolometer-type infrared sensor according to claim 1, wherein 70% or more of the carbon nanotubes contained in the carbon nanotube layer have a diameter within a range of 0.8 to 1.1 nm.

* * * * *